United States Patent [19]

Glendinning

[11] Patent Number: 4,761,560
[45] Date of Patent: Aug. 2, 1988

[54] MEASUREMENT OF PROXIMITY EFFECTS IN ELECTRON BEAM LITHOGRAPHY

[75] Inventor: William B. Glendinning, Red Bank, N.J.

[73] Assignee: The United States of America as represented by the Secretary of the Army, Washington, D.C.

[21] Appl. No.: 573,547

[22] Filed: Jan. 25, 1984

[51] Int. Cl.⁴ .............................................. H01J 3/26
[52] U.S. Cl. ............................. 250/492.2; 250/491.1
[58] Field of Search ................ 250/492.2, 398, 491.1; 430/296, 30

[56] References Cited

U.S. PATENT DOCUMENTS

| | | | |
|---|---|---|---|
| 3,094,049 | 6/1963 | Snelling | 430/30 |
| 4,264,711 | 4/1981 | Greeneich | 430/296 |
| 4,426,584 | 1/1984 | Bohlen et al. | 250/492.2 |
| 4,463,265 | 7/1984 | Owen et al. | 250/492.2 |

FOREIGN PATENT DOCUMENTS 58-114429  7/1983  Japan .................................. 250/492.2

Primary Examiner—Bruce C. Anderson
Assistant Examiner—Paul A. Guss
Attorney, Agent, or Firm—Sheldon Kanars; Robert A. Maikis

[57] ABSTRACT

A test pattern which is applied to a wafer or mask by electron beam lithography for measuring proximity effects. The pattern comprises two lines which intersect at a small angle, for example 1° so that the proximity effects of the two lines combine within the angle to displace the angle vertex by an amount much larger than the proximity effect of an isolated line. A calibration scale is provided to measure this enhanced proximity effect by viewing the pattern with an optical microscope.

7 Claims, 1 Drawing Sheet

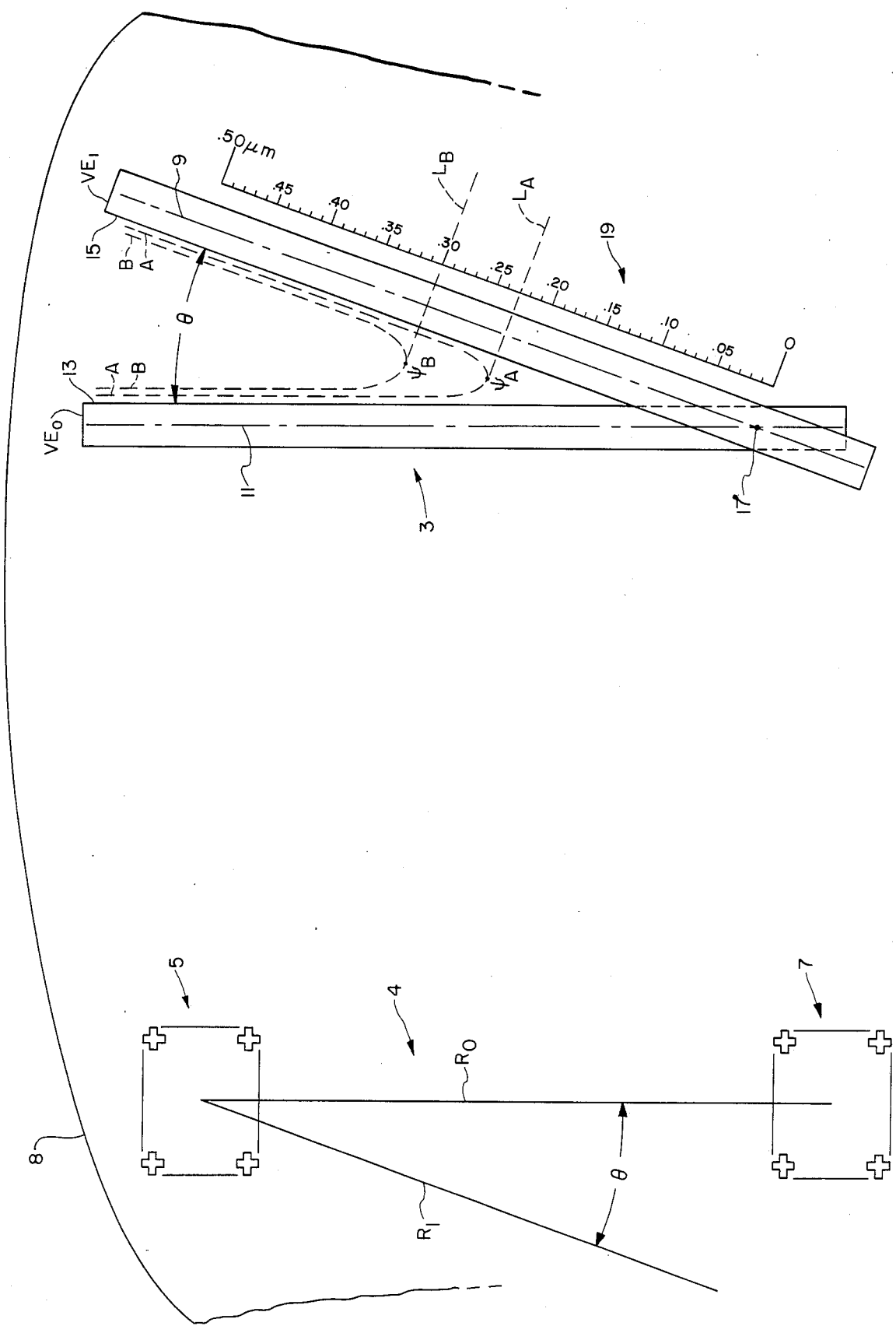

MEASUREMENT OF PROXIMITY EFFECTS IN ELECTRON BEAM LITHOGRAPHY

The invention described herein may be manufactured, used and licensed by or for the Government for governmental purposes without the payment to me of any royalties thereon.

BACKGROUND OF THE INVENTION

The invention is concerned with the measurement of proximity effects which occur in the fabrication of solid state microelectronic circuits by means of a technique known as electron beam lithography. In this technique a pattern of electronic circuits is formed on a mask or directly onto an oxide coated silicon wafer by means of an electron beam which is scanned over the surface of the mask or wafer. The pattern to be lithographed is stored in a computer memory and the computer controls the beam intensity or energy deposit in accordance with the stored pattern program. The wafer or mask is coated with an electron resist material which is exposed when it is impinged by the electron beam. Subsequent development of the mask or wafer will either remove the exposed or the unexposed portion of the resist layer depending on whether the resist is a positive or negative one.

Very large scale integrated circuits of this type necessarily involve closely spaced patterns which require accurate location of electron resist pattern edges. The location of these pattern edges is a function not only of the beam location but also of the proximity effect of the particular wafer or mask being lithographed. The electron beam as it strikes and penetrates the electron resist material will be forward scattered by the molecules of the resist material and as it strikes the underlying silicon dioxide layer it will be backscattered through the resist layer again. This scattering of the electron beam causes the exposed area to overlap the beam edge. The amount of this overlap is a function of numerous factors such as the beam current density, the width of the line or area being lithographed, the resist material and the thickness thereof and the substrate material. Thus the magnitude of the proximity effect varies with the wafer or mask being lithographed and also with the characteristics of the lithography machine. If the magnitude of the proximity effect can be measured, it can be compensated for by modifying the computer software which controls the lithography process. The present invention provides a means and a method of rapidly and accurately measuring this proximity effect.

SUMMARY OF THE INVENTION

The invention involves the lithographing of a test pattern on the wafer or mask under test in such a way that the proximity effects to be measured are enhanced by the geometry of the test pattern. The enhanced proximity effect can then be measured by viewing the developed test pattern with a conventional optical microscope, utilizing a measuring scale which is part of the test pattern. The test pattern may comprise, for example, a pair of lithographed lines which cross at a small angle, for example, less than 1°. The measuring scale is lithographed along one of the lines and has its origin at the point where the centerlines of the two lines cross. Each of the lithographed lines will exhibit the aforementioned proximity effect so that each line as developed will be wider than the sweep of the electron beam which produced it. The combination of the two proximity effects of the lines crossing at the small angle will displace the vertex or corner between the two intersecting lines by a distance which is many times greater than the increase of width of each line due to the proximity effect. This displaced vertex can be optically measured using the aforementioned measuring scale.

The invention thus provides a novel method of measuring proximity effects as well as a novel test pattern for carrying out the method. The invention can be used for in-process control and evaluation of the patterning of submicron dimensions in electron beam lithography and it can also be used to evaluate the scattering properties of new resist materials or of different thicknesses of known resist materials. The use of this technique can increase the accuracy of the patterning of microelectronic chips and thus also permit an increase in patterning density to yield further miniaturization of these devices.

These and other objects and advantages of the invention will become apparent from the following detailed description and the drawings.

BRIEF DESCRIPTION OF THE DRAWINGS

The sole FIGURE shows the test pattern printed or lithographed on a wafer or mask, with a pair of benchmarks utilizxed to facilitate the printing of the test pattern.

DETAILED DESCRIPTION OF A PREFERRED EMBODIMENT

Electron beam lithography (EBL) can be used to directly produce so called working copy masks which are used as photo masks for transferring the circuit patterns thereon to the silicon oxide coated silicon wafer which forms the substrate of the microelectronic circuits. This technique simplifies the production of these masks by eliminating several steps in the older photographic process which required the production of a large scale reticle followed by production of master masks which were reproduced from the reticle by photoreduction. The working copy masks were reproduced from the master masks.

Direct writing electron beam lithography eliminates completely the use of any masks since the beam imprints or lithographs the desired circuit pattern directly onto the silicon wafer, as explained above, under the control of a computer in which the pattern is stored. The present invention is applicable to either of these two EBL techniques.

The drawing shows the test pattern 3 of the present invention printed by direct writing electron beam lithography onto a wafer or mask indicated at 8. A pair of benchmarks 4, each comprising a square group of four crosses, 5 and 7, is also printed on the same wafer or mask, with the two benchmarks widely spaced apart so that each one is near an edge of the wafer or mask at nearly diametrically opposed points. The benchmarks are used to accurately measure the angle at which the two printed lines of the test pattern intersect.

The test pattern 3 comprises a pair of intersecting lines $VE_o$ and $VE_1$, which are printed so that they intersect at a very small angle, $\theta$, of the order of 1° and preferably between 0.1° and 0.5°, inclusive. The size of the angle $\theta$ in the drawing has been greatly exaggerated to facilitate the explanation of the mode of operation of the pattern. The width of the printed lines $VE_o$ and $VE_1$ may for example range from 0.1 microns to 4.0 microns to simulate typical pattern lines encountered in very large scale integrated microelectronic circuits. The centerlines of the two printed lines are the dashed lines 9 and 11, which intersect at the point 17. A measuring scale 19 is printed parallel to one of the two lines, in this case parallel to and adjacent to the line $VE_1$ and having its origin, O, lined up with the point of intersection 17 of the two center lines 9 and 11. The scale is calibrated from 0 to 0.50 in units of microns, as illustrated. The solid line edges of the lines $VE_o$ and $VE_1$ represent the edges which would result in the absence of any proximity effect and thus represent the edges of the path of the electron beam as it sweeps over the wafer or mask to form the pattern. The edges of the two lines $VE_o$ and $VE_1$ which form the angle $\theta$ are referenced as 13 and 15, respectively. The point of intersection of the lines referenced as 13' and 15, respectively, is hereafter referred to as the vertex of the angle $\theta$. The actual pattern edge as displaced by the proximity effect is represented by one or the other of the two dashed line curves labelled A and B, representing two different degrees or magnitudes of proximity effect. The smaller proximity effect represented by curve A might result from one or more of the following causes: a low dose, low backscatter by the substrate or mask, a narrow line width ($VE_o$ or $VE_1$), an underdeveloped positive electron resist, the use of a low sensitivity resist, or a low beam current density. The opposite of one or more of these conditions will increase the width of the proximity effect to yield a pattern edge represented by curve B. The two curves A and B are known as critical dose curves since they represent the edge of the area in which the scattered electrons will be sufficiently intense to cause development of the electron resist.

The distance of the point $\psi_A$ on curve A or $\psi_B$ on curve B from the vertex of the angle $\theta$ or point 17 is a relative measure of the magnitude of the proximity effect. These two points are the points on the curves A and B which are closest to the vertex of the angle $\theta$ or to the point 17. The dashed lines $L_A$ and $L_B$ are lines perpendicular to the line $VE_1$ and to the measuring scale 19 and these lines pass through the points $\psi_A$ and $\psi_B$, respectively, to provide scale readings related to the magnitude of the proximity effect. It can be seen that the spacing of the points $\psi_A$ and $\psi_B$ is much greater than the spacing of the two curves A and B at points more remote from the vertex or from the point 17. The reason for this is that the electron resist in the area between the points $\psi_A$ or $\psi_B$ and point 17 is exposed to the scattering effects from both of the lines $VE_o$ and $VE_1$, whereas an isolated pattern edge would be subjected to the proximity effect from only one side. Also, simply increasing the width of two lines which cross at a small angle will displace the vertex thereof by many times the amount of the width increase. The 0.50 micron scale can be easily read if the developed test pattern is viewed with a conventional optical microscope. With the actual test patterns having an angle of intersection of less than 1° as stated above, the enhancement of the proximity effect would be even greater than is illustrated by the drawing, in which the angle $\theta$ is approximately 20°. Thus this test pattern and technique permits proximity effects in the submicron region to be enhanced to tens of microns which can be easily optically read and measured.

The novel technique and method of measuring proximity effects of submicron dimensions comprises the steps of lithographing a pair of straight lines on a wafer or mask with an electron beam, with the lines crossing at an angle less than 1° and further printing a measuring scale on said wafer or mask parallel to one of said lines and having its origin lined up with the intersection of said lines or with the intersection of the centerlines of said lines, and then optically measuring the distance from said vertex or intersection to the closest unexposed portion of said wafer or mask which lies between the said two lines.

The steps in the printing and the use of novel test pattern will be described in connection with an electron beam lithography (EBL) machine made by ETEC Corporation and known as the LEBES, meaning Laboratory Electron Beam Exposure System. This machine can function as a scanning electron microscope (SEM) as well as an EBL machine.

The wafer or mask 8 (or the sample) is first inserted into the stage of the LEBES and the two benchmarks 5 and 7 are exposed thereon by the electron beam, the sample is then removed and the benchmark patterns developed and the oxide underlying the benchmarks etched. The stage is a mechanically moveable table in which the sample is mounted for insertion into the evacuated base area of the column of the machine where it will be in the path of the focused and deflected electron beam. The sample is then re-inserted in the LEBES and aligned with the printed benchmarks. When so aligned the test pattern line $VE_o$ can be exposed parallel to the line $R_o$ which joins the centers of the two benchmarks 5 and 7. The sample is again removed and the line $VE_o$ developed. The sample is then re-inserted in the stage of the LEBES, but upon re-insertion it will be in a slightly different position due to mechanical backlash in the stage system. The LEBES includes a laser interferometer which can detect the stage position relative to its former position and this stage error can be used to re-align the stage relative to the scanning or field axis by electrically varying the field control settings. The aforementioned stage error will normally be less than 1° and thus can conveniently be used to determine the angle $\theta$ at which the two lines of the test pattern cross each other. Thus the angular change in the field axis required to achieve realignment can be noted and then the deflection field axis can be mis-aligned relative to the stage axis by the angle $\theta$ using the Alignment and $\Delta$ Field controls of the Field Control Module of the LEBES. The line $VE_1$ with the measuring scale 19 parallel thereto is then printed parallel to the line $R_1$. The sample is then removed and developed to reveal the pattern edges such as the curves A or B. An optical microscope can then be used to locate the points $\psi_A$ or $\psi_B$ relative to scale 19 as explained above. A straight edge can be moved along the scale parallel to the lines $L_A$ and $L_B$ to read the numerical scale value corresponding to the points $\psi_A$ or $\psi_B$.

Another technique of printing the test pattern would be to first print the line $VE_o$ on the sample and then rotate the field axis of the LEBES through the desired angle $\theta$ by means of the alignment control potentiometers of the Field Control Module, after which the line $VE_1$ and the scale 19 would be printed. This technique would require that these potentiometers be calibrated to relate the settings thereof to the field axis rotation.

The scale 19 can be calibrated in full scale units of distance or at a reduced scale representing the proximity effect of an isolated pattern edge. This reduced scale would be related to the full scale by a factor equal to the enhancement of the proximity effect due to the use of the test pattern, which factor is approximately equal to the reciprocal of tan $\theta$ when the origin of scale 19 is lined up with the vertex of angle. Such a scale may also be calibrated to provide direct readings of proximity effects when it has its origin lined up with the point 17, as illustrated in scale 19 in the drawing.

While the invention has been described in connection with illustrative embodiments, obvious variations therein will occur to those skilled in the art, accordingly the invention should be limited only by the scope of the appended claims.

I claim:

1. A method of measuring submicron proximity effects caused by electron beam scattering in electron beam lithography, comprising the steps of lithographing with an electron beam on a wafer or mask under test a test pattern comprising a pair of straight lines, with said lines crossing at an angle of less than one degree, and further lithographing a measuring scale on said wafer or mask parallel to one of said lines and having its origin lined up with the intersection of said lines, or with the intersection of the centerlines of said lines, and then opitically measuring the distance from said intersection to the closest unexposed portion of said wafer or mask which lies between the two lines.

2. A method of measuring extremely small proximity effects in electron beam lithography; comprising the steps of lithographing on a wafer or mask a test pattern comprising a pair of straight lines which intersect at a small angle of the order of one degree, whereby the overlapping of the proximity effects of said two lines within said small angle will displace the vertex of said lines by a distance many times the magnitude of said proximity effect where said lines are isolated from each other, and measuring the displacement of said vertex from the intersection of said lines with an optical microscope to obtain a reading related to said extremely small proximity effect.

3. A method of measuring submicron proximity effects in the fabrication of very large scale integrated microelectronic circuits by means of electron beam lithography, comprising the steps of lithographing on a wafer or mask under test a test pattern comprising a pair of lines intersecting at an angle, for enhancing the proximity effects within said angle so that said submicron proximity effects will be increased to the order of tens of microns, and measuring the distance from the intersection of said pair of lines to the closest unexposed portion of said wafer or mask which lies between said pair of lines by means of a conventional optical microscope.

4. A method of measuring submicron proximity effects in the fabrication of very large scale integrated microelectronic circuits by means of electron beam lithography, comprising the steps of lithographing on a wafer or mask under test a test pattern comprising a pair of lines intersecting at an angle, for enhancing the proximity effects within said angle by at least an order of magnitude compared to the proximity effects of said lines at isolated locations, and measuring the enhanced proximity effect.

5. A test pattern for enhancing the proximity effects in electron beam lithography, comprising a pair of straight lines which have been lithographed onto a wafer or mask to be tested, said lines crossing at an angle whereby the proximity effects within said angle will be enhanced to such a degree that they can be measured with an optical microscope.

6. The test pattern of claim 5 wherein said angle is less than 1°.

7. A test pattern for measuring the proximity effect in electron beam lithography comprising a wafer or mask under test with a pair of intersecting straight lines lithographed thereon by means of an electron beam, the angle of intersection of said lines being sufficiently small to enhance the proximity effect within said angle by several orders of magnitude, and a measuring scale printed parallel to and adjacent one of said lines, said measuring scale being adapted to measure the enhanced proximity effect.

* * * * *